United States Patent
Takeoka et al.

(10) Patent No.: US 10,154,597 B2
(45) Date of Patent: Dec. 11, 2018

(54) COMPONENT MOUNT BOARD

(71) Applicant: Murata Manufacturing Co., Ltd., Nagaokakyo-shi, Kyoto-fu (JP)

(72) Inventors: Makoto Takeoka, Nagaokakyo (JP); Masaki Kawata, Nagaokakyo (JP); Tomohiko Naruoka, Nagaokakyo (JP); Hayato Noma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/956,787

(22) Filed: Apr. 19, 2018

(65) Prior Publication Data
US 2018/0242459 A1 Aug. 23, 2018

Related U.S. Application Data

(63) Continuation of application No. PCT/JP2016/080465, filed on Oct. 14, 2016.

(30) Foreign Application Priority Data

Nov. 5, 2015 (JP) ................................ 2015-217374

(51) Int. Cl.
*H01L 23/00* (2006.01)
*H05K 3/28* (2006.01)
(Continued)

(52) U.S. Cl.
CPC ............. *H05K 3/284* (2013.01); *H01L 23/29* (2013.01); *H01L 23/3128* (2013.01); *H05K 3/34* (2013.01); *H05K 3/46* (2013.01)

(58) Field of Classification Search
CPC ..................... H01L 23/29; H01L 23/3128
See application file for complete search history.

(56) References Cited

U.S. PATENT DOCUMENTS 5,490,324 A * 2/1996 Newman ............. H01L 23/3128
174/534
6,861,588 B2 * 3/2005 Sakai ................ H01L 23/49822
174/524
(Continued)

FOREIGN PATENT DOCUMENTS

JP 2005-136043 A 5/2005
JP 2014-179612 A 9/2014
(Continued)

OTHER PUBLICATIONS

Official Communication issued in International Patent Application No. PCT/JP2016/080465, dated Nov. 29, 2016.

*Primary Examiner* — Hung V Ngo
(74) *Attorney, Agent, or Firm* — Keating & Bennett, LLP

(57) ABSTRACT

A component mount board includes a resin board, an electronic component, and a molding resin. A land conductor is provided in the resin board. The electronic component is mounted on a surface of the resin board, and includes a mounting terminal that is bonded to the land conductor. The resin board includes a body resin portion including the land conductor provided on a surface thereof, and a surface resin layer disposed on a surface of the body resin portion and made of a material of the same type as that of the body resin portion. A conductor is not provided on a surface of the surface resin layer. The surface resin layer includes a through hole at which the land conductor is exposed from the surface of the resin board. The mounting terminal is bonded to the land conductor via a bonding material filled in the through hole.

20 Claims, 5 Drawing Sheets

(51) Int. Cl.
    *H05K 3/46*    (2006.01)
    *H05K 3/34*    (2006.01)
    *H01L 23/31*   (2006.01)
    *H01L 23/29*   (2006.01)

(56) References Cited

U.S. PATENT DOCUMENTS

| | | | | |
|---|---|---|---|---|
| 6,998,532 | B2* | 2/2006 | Kawamoto | H01L 24/16 |
| | | | | 174/521 |
| 7,382,628 | B2* | 6/2008 | Kawamoto | H05K 3/284 |
| | | | | 174/257 |
| 8,988,885 | B2* | 3/2015 | Sawatari | H01L 23/552 |
| | | | | 174/255 |
| 2002/0046854 | A1* | 4/2002 | Huang | H01L 21/565 |
| | | | | 174/528 |
| 2005/0067177 | A1* | 3/2005 | Saito | H01L 21/4857 |
| | | | | 174/521 |
| 2006/0102374 | A1* | 5/2006 | Heide | H01L 23/3135 |
| | | | | 174/529 |
| 2010/0079035 | A1* | 4/2010 | Matsuzawa | B29C 39/10 |
| | | | | 310/340 |
| 2014/0030471 | A1 | 1/2014 | Otsubo | |
| 2014/0264799 | A1 | 9/2014 | Gowda et al. | |
| 2014/0264800 | A1 | 9/2014 | Gowda et al. | |

FOREIGN PATENT DOCUMENTS

| | | |
|---|---|---|
| WO | 2012/137626 A1 | 10/2012 |
| WO | 2014/024754 A1 | 2/2014 |
| WO | 2014/097835 A1 | 6/2014 |

\* cited by examiner

COMPONENT MOUNT BOARD

CROSS REFERENCE TO RELATED APPLICATIONS

This application claims the benefit of priority to Japanese Patent Application No. 2015-217374 filed on Nov. 5, 2015 and is a Continuation Application of PCT Application No. PCT/JP2016/080465 filed on Oct. 14, 2016. The entire contents of each application are hereby incorporated herein by reference.

BACKGROUND OF THE INVENTION

1. Field of the Invention

The present invention relates to a component mount board including a resin board on or in which a conductor pattern is provided, and a component mounted on a surface of the resin board.

2. Description of the Related Art

In many cases, various electronic devices include component mount boards. For example, International Publication No. 2014/097835 describes a component mount board including a resin board and an electronic component. The electronic component is mounted on a surface of the resin board.

On the surface of the resin board of the component mount board described in International Publication No. 2014/097835, a sealing resin layer that covers the surface and the entire electronic component is formed.

When a sealing resin layer made of a kind of material different from the kind of material of a resin board is formed on a surface of the resin board like the component mount board described in International Publication No. 2014/097835, a chemical bonding layer having a high bonding strength is formed at the interface between the sealing resin layer and the resin board.

However, since the chemical coupling layer is formed, the conductivity of a conductor pattern exposed from the surface of the resin board may be decreased due to oxidation or the like.

In contrast, if a typical insulating resist film is formed on the surface of the resin board and the sealing resin layer is formed on the surface of the insulating resist film, the bonding strength is decreased, and it may be difficult to maintain high reliability.

SUMMARY OF THE INVENTION

Preferred embodiments of the present invention provide component mount boards that, even if a sealing resin layer and a resin board are made of different materials, maintain high bonding strength between the sealing resin layer and the resin board and securely reduce or prevent a decrease in electrical characteristics.

According to a preferred embodiment of the present invention, a component mount board includes a resin board, a first component, and a molding resin. A conductor pattern including a component-mounting land conductor is provided on or in a resin board. The first component is mounted on a surface of the resin board, and includes a mounting terminal that is bonded to the land conductor. The molding resin covers the surface of the resin board and the first component, and is made of a material different from a material of the resin board. Further, the resin board includes a body resin portion including a surface on which the land conductor is provided, and a surface resin layer disposed on a surface of the body resin portion and made of a material of the same type as a type of a material of the body resin portion. A conductor is not provided on a surface of the surface resin layer. The surface resin layer includes a through hole at which a land conductor is exposed from the surface of the resin board. The mounting terminal is bonded to the land conductor via a bonding material with which the through hole is filled.

With this configuration, the conductor pattern provided on or in the body resin portion of the resin board does not contact the molding resin. Also, the surface of the land conductor is covered with the bonding material and the mounting terminal of the first component, and does not contact the molding resin. Accordingly, oxidation of the conductor pattern provided on or in the resin board due to the molding resin is significantly reduced or prevented.

Preferably, in a component mount board according to a preferred embodiment of the present invention, the surface resin layer and the body resin portion include a liquid crystal polymer, and the molding resin includes a silicon resin.

With this configuration, the electrical characteristics of the resin board are improved, and the bonding strength between the resin board and the molding resin is increased.

A component mount board according to a preferred embodiment of the present invention may include a second component built in the body resin portion.

With this configuration, electronic circuits provided by the component mount board become further multifunctional while the improved reliability is obtained.

Preferably, a Young's modulus of the resin board is higher than a Young's modulus of the molding resin.

With this configuration, the first component is protected from an external impact. In addition, the difference between the Young's modulus of the first component typically made of a material with a high Young's modulus, such as ceramics or silicon, for example, and the Young's modulus of the resin board is decreased. Thus, the first component is unlikely to fall or detach from the resin board.

A component mount board according to a preferred embodiment of the present invention may be configured as follows. The molding resin is made of a material having a lower Young's modulus than a Young's modulus of the material of the surface resin layer and a Young's modulus of the material of the body resin portion. A ratio of a volume of the second component to a volume of the resin board including the second component is smaller than a ratio of a volume of the first component to a total volume of the molding resin and the first component.

With this configuration, a space for a wiring pattern is able to be sufficiently ensured in the resin board, and the internal stress of the resin board caused by the second component (built-in component) is able to be decreased. With regard to the first component (surface mount device), even if an internal stress is generated in the molding resin, the molding resin made of a material having a low Young's modulus is relatively easily deformable, and thus a crack or other damage is unlikely to occur. Therefore, even in a case in which the component mount board includes a component mounted thereon or built therein, the component mount board is able to reduce or prevent defects, such as cracks.

With preferred embodiments of the present invention, even if a sealing resin layer and a resin board are made of different materials, high bonding strength is maintained between the sealing resin layer and the resin board, and a decrease in electrical characteristics is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
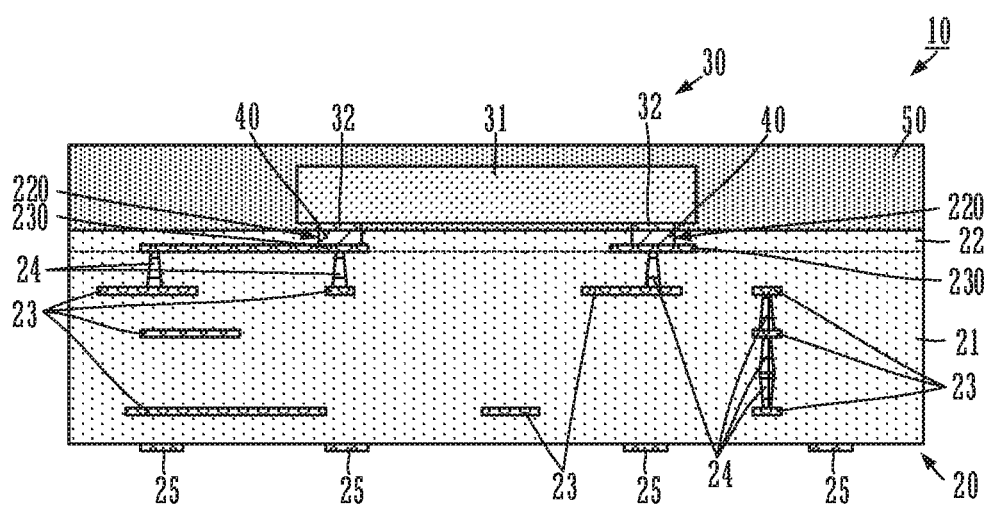
FIG. 1 is a side cross-sectional view illustrating a configuration of a component mount board according to a first preferred embodiment of the present invention.
Figure 2:
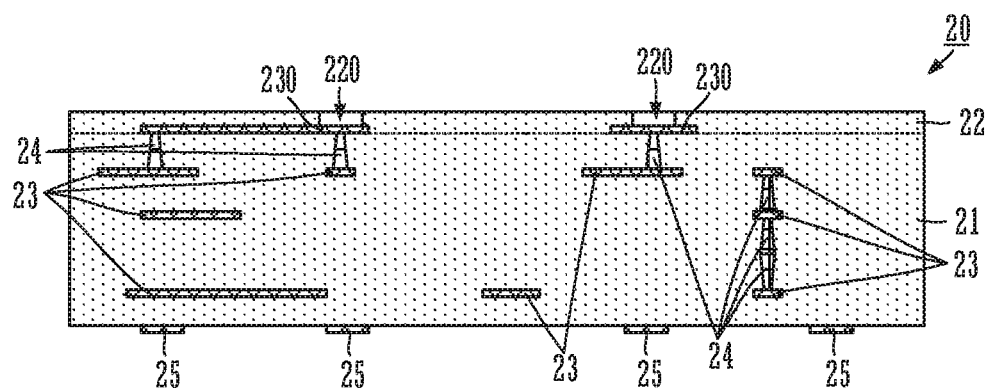
FIG. 2 is a side cross-sectional view illustrating a configuration of a resin board according to the first preferred embodiment of the present invention.
Figure 3:
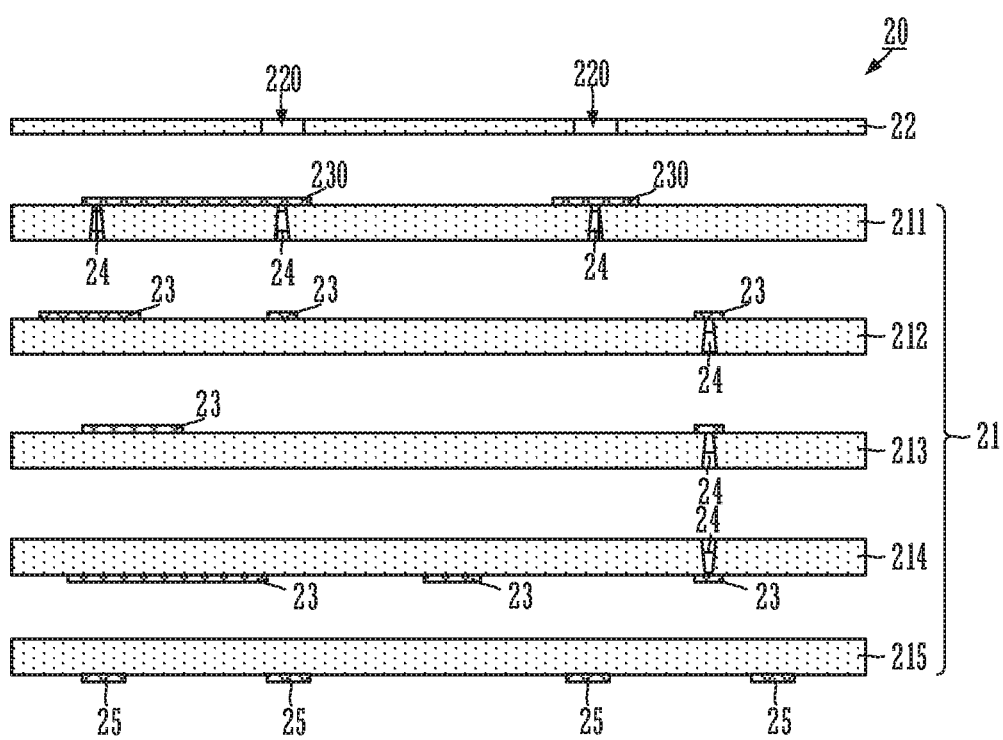
FIG. 3 is a side cross-sectional view illustrating the configuration of the resin board according to the first preferred embodiment of the present invention when respective layers are illustrated in an exploded state.

A component mount board according to a first preferred embodiment of the present invention is described with reference to the drawings. FIG. 1 is a side cross-sectional view illustrating a configuration of the component mount board according to the first preferred embodiment of the present invention. FIG. 2 is a side cross-sectional view illustrating a configuration of a resin board according to the first preferred embodiment of the present invention. FIG. 3 is a side cross-sectional view illustrating the configuration of the resin board according to the first preferred embodiment of the present invention when respective layers are illustrated in an exploded state.

As illustrated in FIG. 1, a component mount board 10 includes a resin board 20, an electronic component 30, and a molding resin 50.

As illustrated in FIGS. 1, 2, and 3, the resin board 20 includes a body resin portion 21 and a surface resin layer 22. The body resin portion 21 includes a plurality of resin layers 211, 212, 213, 214, and 215. The plurality of resin layers 211, 212, 213, 214, and 215 are stacked in that order from a front surface side.

The plurality of resin layers 211, 212, 213, 214, and 215 and the surface resin layer 22 are preferably made of the same resin material. For example, the plurality of resin layers 211, 212, 213, 214, and 215 and the surface resin layer 22 preferably include a liquid crystal polymer as a main component. Since the main component is a liquid crystal polymer, electrical characteristics, such as high-frequency characteristics, are improved.

The body resin portion 21 including the plurality of resin layers 211, 212, 213, 214, and 215, and the surface resin layer 22 are integrally provided. The surface resin layer 22 is disposed on a surface of the resin layer 211 on a side opposite to a side of the resin layer 212. In other words, the surface resin layer 22 is disposed on a front surface of the body resin portion 21.

A land conductor 230 is provided on the front surface of the body resin portion 21. The land conductor 230 is a conductor to which the electronic component 30 is surface mounted. The land conductor 230 includes a wiring conductor extending to another circuit element of the body resin portion 21. A plurality of external-connection terminal conductors 25 are provided on a back surface of the body resin portion 21. A plurality of circuit conductors 23 and a plurality of interlayer connection conductors are provided in the body resin portion 21. The circuit conductors 23 and the interlayer connection conductors 24 are structured in accordance with a circuit configuration that is provided in the resin board 20. The land conductor 230, the circuit conductors 23, the interlayer connection conductors 24, and the external-connection terminal conductors 25 correspond to "a conductor pattern provided on or in a resin board."

The surface resin layer 22 includes a through hole 220 that extends through the surface resin layer 22 from a front surface to a back surface thereof. The through hole 220 is provided at a position overlapping a portion of the land conductor 230 in a state in which the surface resin layer 22 is disposed on the front surface of the body resin portion 21. With this configuration, the portion of the land conductor 230 is exposed through the through hole 220 from the front surface of the resin board 20 in which the surface resin layer 22 is disposed on the front surface of the body resin portion 21. In other words, a conductor pattern other than the land conductor 230 is not exposed from the front surface of the resin board 20.

The electronic component 30 includes a main body 31 and a mounting terminal 32. The mounting terminal 32 is made of a conductor and is connected to an electronic circuit provided in the main body 31. The mounting terminal 32 is provided on a back surface of the main body 31.

The electronic component 30 is disposed on the front surface of the resin board 20 such that the mounting terminal 32 is located on a side of the resin board 20. At this time, the mounting terminal 32 faces the land conductor 230 via the through hole 220. In this state, the mounting terminal 32 is bonded to the land conductor 230 via a conductive bonding material 40 with which the through hole 220 is filled. The bonding material 40 is preferably, for example, solder or a conductive adhesive.

The molding resin 50 has insulating properties. The molding resin 50 is preferably made of a material different from the resin from which the resin board 20 is made, that is, the resin from which the resin layers 211, 212, 213, 214, and 215, and the surface resin layer 22 are made. The resin of the molding resin 50 is preferably made of a material that provides a high bonding strength to the resin of the resin board 20. Specifically, when the resin of the resin board 20 includes the liquid crystal polymer as a main component, the molding resin 50 preferably includes silicone, for example, as a main component. The molding resin 50 may further include an insulating filler or the like.

The molding resin 50 covers the front surface of the resin board 20 on which the electronic component 30 is mounted. At this time, the molding resin 50 also covers the electronic component 30. With this configuration, the front surface side of the resin board 20 on which the electronic component 30 is mounted is protected from the external environment, and the reliability of the component mount board 10 is improved.

Also, in the first preferred embodiment, the conductor pattern other than the land conductor 230 is not exposed from the front surface of the resin board 20. The land conductor 230 is covered with the bonding material 40 and the mounting terminal 32 of the electronic component 30. Thus, the molding resin 50 does not contact the conductor pattern of the resin board 20. Accordingly, a decrease in conductivity of the conductor pattern due to the contact of the molding resin 50 with the conductor pattern is reduced or prevented. Therefore, the decrease in electrical characteristics of the component mount board 10 is reduced or prevented.

By using the configuration according to the first preferred embodiment as described above, the component mount board 10 having high reliability and good electrical characteristics is provided.

Also, with the configuration according to the first preferred embodiment, the through hole 220 provided in the surface resin layer 22 results in a recess in the front surface of the resin board 20, and the bonding material 40 is provided in the recess. Accordingly, an unnecessary flow of the bonding material 40 is reduced or prevented, and an occurrence of a defect, such as leakage, due to the flow of the bonding material 40 is reduced or prevented. Thus, the component mount board 10 having even higher reliability is provided.

Also, the Young's modulus of the resin board 20 is preferably higher than the Young's modulus of the molding resin 50. With this configuration, the electronic component 30 is protected from an external impact. In addition, the difference between the Young's modulus of the electronic component 30 preferably made of a material with a high Young's modulus, such as ceramics or silicon, for example, and the Young's modulus of the resin board 20 is decreased. Thus, the electronic component 30 is unlikely falls or detach from the resin board 20.

The component mount board 10 with the above-described configuration may preferably be manufactured by the following steps, for example.

First, the conductor pattern is formed on or in each of the plurality of resin layers 211, 212, 213, 214, and 215. Specifically, the circuit conductors 23, the land conductor 230, and the external-connection terminal conductors 25 are formed by providing patterning and etching on resin layers coated with copper on one side surfaces thereof. Also, through holes are formed using a laser or other suitable device from the other side surfaces opposite to the one side surfaces coated with copper of predetermined resin layers. The through holes are filled with the conductive paste that defines as the interlayer connection conductors 24. Also, the through hole 220 is formed in the surface resin layer 22.

The surface resin layer 22 and the plurality of resin layers 211, 212, 213, 214, and 215 are stacked, heated, and pressure bonded. By the pressure bonding with heat, the conductive paste is solidified and the interlayer connection conductors 24 are formed. Accordingly, the resin board 20 including the recess in the front surface due to the through hole 220 of the surface resin layer 22 is formed. At this time, a conductor is not exposed from the front surface of the resin board 20 except the portion of the land conductor 230 exposed through the through hole 220.

The through hole 220 of the resin board 20 is filled with, for example, solder paste. The electronic component 30 is mounted on the front surface of the resin board 20. At this time, the electronic component 30 is mounted such that the mounting terminal 32 of the electronic component 30 faces the through hole 220. The resin board 20 on which the electronic component 30 is mounted is heat treated to solidify the solder. The mounting terminal 32 of the electronic component 30 is bonded to the land conductor 230 of the resin board 20 by the solidified solder.

The molding resin 50 is applied to the front surface of the resin board 20 to which the electronic component 30 is bonded. The heat treatment is performed in this state, and thus, the molding resin 50 is solidified. The component mount board 10 is preferably formed by the steps described above.

Figure 4:
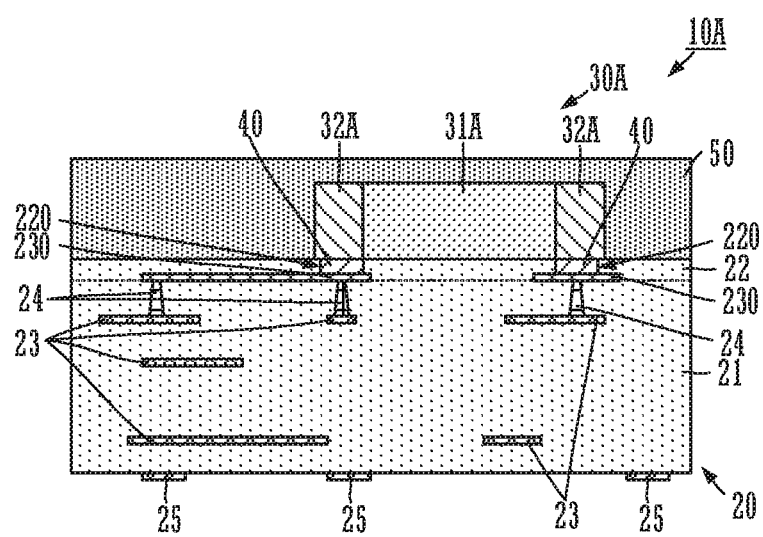
FIG. 4 is a side cross-sectional view illustrating a configuration of a component mount board according to a second preferred embodiment of the present invention.

Next, a component mount board according to a second preferred embodiment of the present invention is described with reference to the drawings. FIG. 4 is a side cross-sectional view illustrating a configuration of the component mount board according to the second preferred embodiment of the present invention.

A component mount board 10A according to the second preferred embodiment differs from the component mount board 10 according to the first preferred embodiment for an electronic component 30A. The other basic configurations of the component mount board 10A are the same as or similar to those of the component mount board 10 according to the first preferred embodiment except that the wiring pattern of a resin board 20 is changed in accordance with the shape of the electronic component 30A.

The electronic component 30A includes a main body 31A and a mounting terminal 32A. The mounting terminal 32A is provided on both opposite ends of the main body 31A. One surface of the mounting terminal 32A is bonded to a land conductor 230 via a bonding material 40. With this configuration, the land conductor 230 is covered with the bonding material 40 and the mounting terminal 32A, and a conductor is not exposed from a front surface of the resin board 20.

Accordingly, the component mount board 10A according to the second preferred embodiment provides advantageous effects similar to those of the component mount board 10 according to the first preferred embodiment.

Also, in the component mount board 10A according to the second preferred embodiment, the main body 31A of the electronic component 30A contacts the front surface of the resin board 20. Accordingly, the above-described solder flow is able to be further reduced or prevented, and the reliability is further improved. To allow the main body 31A of the electronic component 30A to contact the front surface of the resin board 20, the portion of the front surface of the resin board 20 may be raised or another insulating member may be interposed. Further, the configuration in which the main body 31A of the electronic component 30A contacts the resin board 20 may be applied to the electronic component 30 and the main body 31 of the component mount board 10 described in the first preferred embodiment.

Figure 5:
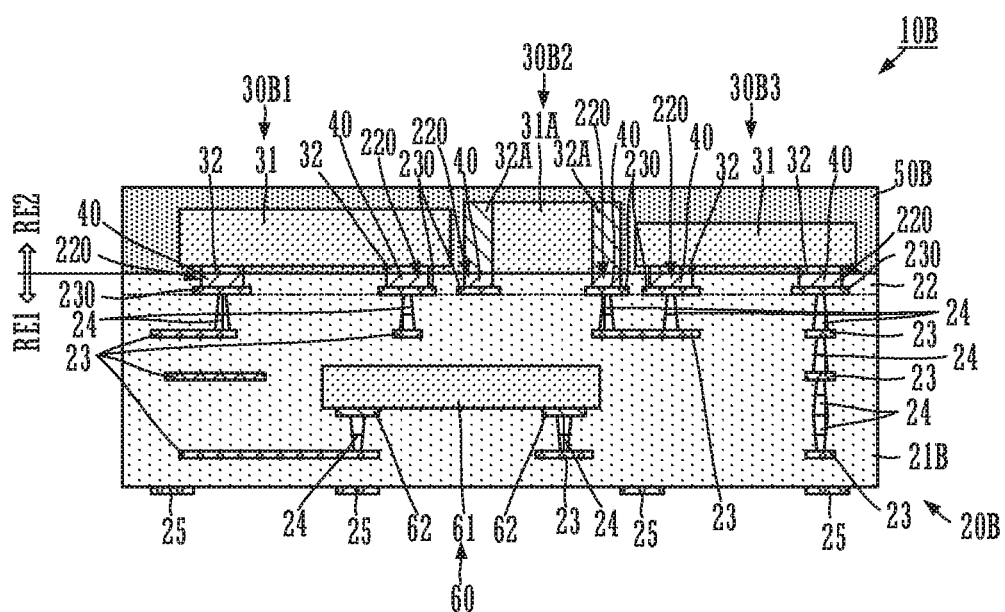
FIG. 5 is a side cross-sectional view illustrating a configuration of a component mount board according to a third preferred embodiment of the present invention.

Next, a component mount board according to a third preferred embodiment of the present invention is described with reference to the drawings. FIG. 5 is a side cross-sectional view illustrating a configuration of the component mount board according to the third preferred embodiment of the present invention.

A component mount board 10B according to the third preferred embodiment differs from the component mount boards 10 and 10A according to the first and second preferred embodiments in that electronic components 30B1, 30B2, and 30B3 are mounted on a resin board 20B, and an electronic component 60 is built in the resin board 20B. The other basic configurations of the component mount board 10B according to the third preferred embodiment are the same as or similar to those of the component mount boards 10 and 10A according to the first and second preferred embodiments.

The electronic components 30B1 and 30B3 have the same or substantially the same structure as that of the electronic component 30 according to the first preferred embodiment. The electronic component 30B2 has the same or substantially the same structure as that of the electronic component 30A according to the second preferred embodiment. Mounting terminals 32 of the electronic components 30B1 and 30B3, and a mounting terminal 32A of the electronic component 30B2 are bonded to land conductors 230 of the resin board 20B via bonding materials 40 provided in through holes 220.

The electronic component 60 includes a main body 61 and a mounting terminal 62. The mounting terminal 62 is provided on a back surface of the main body 61. The electronic component 60 is built in a body resin portion 21B of the resin board 20B. The mounting terminal 62 is connected to circuit conductors 23 via interlayer connection conductors 24.

A molding resin 50B is provided on a front surface of the resin board 20B and covers the entire or substantially the entire front surface thereof and the electronic components 30B1, 30B2, and 30B3.

The molding resin 50B is preferably made of a material of the same type as the type of the molding resin 50 according to the first preferred embodiment. The molding resin 50B is preferably made of a material having a lower Young's modulus than that of the material of the resin forming the resin board 20B.

As illustrated in FIG. 5, in the component mount board 10B, the ratio of the volume of the electronic component 60 to the volume of the resin board 20B is preferably smaller than the ratio of the total volume of the electronic components 30B1, 30B2, and 30B3 to the total volume of the molding resin 50B and the electronic components 30B1, 30B2, and 30B3. In other words, the ratio of the volume occupied by the electronic component in a resin-board-side region RE1 is smaller than the ratio of the volume occupied by the electronic components in a molding-resin-side region RE2.

The electronic components 30B1, 30B2, 30B3, and 60 preferably have higher Young's moduli than that of the resin of the resin board 20B. Thus, since the electronic components are disposed under the conditions of the above-described volume ratios, a stress that is generated at the interface between the molding resin 50B and the resin board 20B due to the difference in Young's modulus is reduced or prevented even if the Young's modulus of the molding resin 50B is lower than that of the resin forming the resin board 20B. Accordingly, a breakage at the interface is reduced or prevented, and the component mount board 10B having even higher reliability is provided.

Also, by using the configuration according to the third preferred embodiment, the region in which the wiring pattern of the conductors is extended is able to be widely provided in the resin board 20B. Accordingly, the wiring conductor patterns for the electronic components 30B1, 30B2, and 30B3 are easily extended, and coupling between the conductor patterns is able to be reduced or prevented. Thus, the component mount board 10B having better electrical characteristics is provided.

Also, by using the configuration according to the third preferred embodiment, the internal stress of the resin board 20B due to the electronic component (built-in component) 60 is able to be decreased. With regard to the electronic components (surface mount devices) 30B1, 30B2, and 30B3, even if an internal stress is generated in the molding resin 50B, the molding resin 50B made of a material having a low Young's modulus is relatively easily deformable, and thus cracks and other damage are unlikely to occur. Therefore, even if a component is mounted on or built in a resin board, the component mount board 10B that is unlikely to have a defect, such as a crack, is provided.

While an electronic component is exemplified as a component mounted on a resin board in each of the above-described preferred embodiments, the component is not limited to the electronic component, and may only be provided with a mounting terminal and mounted on a resin board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component mount board comprising:
   a resin board on or in which a conductor pattern including a component-mounting land conductor is provided;
   a first component mounted on a surface of the resin board, and including a mounting terminal that is bonded to the land conductor; and
   a molding resin covering the surface of the resin board and the first component, and made of a material different from a material of the resin board; wherein
   the resin board includes:
      a body resin portion including a surface on which the land conductor is provided; and
      a surface resin layer disposed on the surface of the body resin portion, and made of a material of the same type as a type of a material of the body resin portion;
   a conductor is not provided on a surface of the surface resin layer, and the surface resin layer includes a through hole at which the land conductor is exposed from the surface of the resin board;
   the mounting terminal is bonded to the land conductor by a bonding material with which the through hole is filled;
   the surface resin layer and the body resin portion include a liquid crystal polymer; and
   the molding resin includes a silicone resin.

2. The component mount board according to claim 1, wherein the body resin portion includes a plurality of resin layers.

3. The component mount board according to claim 1, wherein the conductor pattern includes a plurality of external-connection terminal conductors provided on another surface of the body resin portion opposite to the surface on which the land conductor is provided.

4. The component mount board according to claim 1, wherein the conductor pattern includes a plurality of circuit conductors and a plurality of interlayer connection conductors provided in the body resin portion.

5. The component mount board according to claim 1, wherein the through hole is provided at a position overlapping a portion of the land conductor.

6. The component mount board according to claim 1, wherein the bonding material includes a solder.

7. A component mount board comprising:
   a resin board on or in which a conductor pattern including a component-mounting land conductor is provided;
   a first component mounted on a surface of the resin board, and including a mounting terminal that is bonded to the land conductor; and
   a molding resin covering the surface of the resin board and the first component, and made of a material different from a material of the resin board; wherein
   the resin board includes:
      a body resin portion including a surface on which the land conductor is provided; and a surface resin layer disposed on the surface of the body resin portion, and made of a material of the same type as a type of a material of the body resin portion;

a conductor is not provided on a surface of the surface resin layer, and the surface resin layer includes a through hole at which the land conductor is exposed from the surface of the resin board;

the mounting terminal is bonded to the land conductor by a bonding material with which the through hole is filled; and a Young's modulus of the resin board is higher than a Young's modulus of the molding resin.

8. The component mount board according to claim 7, wherein the surface resin layer and the body resin portion include a liquid crystal polymer; and the molding resin includes a silicone resin.

9. The component mount board according to claim 7, wherein the body resin portion includes a plurality of resin layers.

10. The component mount board according to claim 7, wherein the conductor pattern includes a plurality of external-connection terminal conductors provided on another surface of the body resin portion opposite to the surface on which the land conductor is provided.

11. The component mount board according to claim 7, wherein the conductor pattern includes a plurality of circuit conductors and a plurality of interlayer connection conductors provided in the body resin portion.

12. The component mount board according to claim 7, wherein the through hole is provided at a position overlapping a portion of the land conductor.

13. The component mount board according to claim 7, wherein the bonding material includes a solder.

14. A component mount board comprising:

a resin board on or in which a conductor pattern including a component-mounting land conductor is provided;

a first component mounted on a surface of the resin board, and including a mounting terminal that is bonded to the land conductor; and a molding resin covering the surface of the resin board and the first component, and made of a material different from a material of the resin board; wherein the resin board includes:

a body resin portion including a surface on which the land conductor is provided; and a surface resin layer disposed on the surface of the body resin portion, and made of a material of the same type as a type of a material of the body resin portion;

a conductor is not provided on a surface of the surface resin layer, and the surface resin layer includes a through hole at which the land conductor is exposed from the surface of the resin board;

the mounting terminal is bonded to the land conductor by a bonding material with which the through hole is filled;

the component mount board includes a second component built in the body resin portion;

the molding resin is made of a material having a lower Young's modulus than a Young's modulus of the material of the surface resin layer and a Young's modulus of the material of the body resin portion; and a ratio of a volume of the second component to a volume of the resin board including the second component is smaller than a ratio of a volume of the first component to a total volume of the molding resin and the first component.

15. The component mount board according to claim 14, wherein the surface resin layer and the body resin portion include a liquid crystal polymer; and the molding resin includes a silicone resin.

16. The component mount board according to claim 14, wherein the body resin portion includes a plurality of resin layers.

17. The component mount board according to claim 14, wherein the conductor pattern includes a plurality of external-connection terminal conductors provided on another surface of the body resin portion opposite to the surface on which the land conductor is provided.

18. The component mount board according to claim 14, wherein the conductor pattern includes a plurality of circuit conductors and a plurality of interlayer connection conductors provided in the body resin portion.

19. The component mount board according to claim 14, wherein the through hole is provided at a position overlapping a portion of the land conductor.

20. The component mount board according to claim 14, wherein the bonding material includes a solder.

* * * * *